United States Patent [19]

Stevenson et al.

[11] Patent Number: 4,675,551
[45] Date of Patent: Jun. 23, 1987

[54] DIGITAL LOGIC BUS TERMINATION USING THE INPUT CLAMPING SCHOTTKY DIODES OF A LOGIC CIRCUIT

[75] Inventors: Alexander J. Stevenson, Holliston; Gordon A. Ross, Norfolk; Donald C. Manson, Northbridge, all of Mass.

[73] Assignee: Prime Computer, Inc., Natick, Mass.

[21] Appl. No.: 835,997

[22] Filed: Mar. 4, 1986

[51] Int. Cl.[4] .................... H03K 17/16; H03K 17/76
[52] U.S. Cl. .......................... 307/443; 307/200 A; 307/456; 307/542; 307/559; 307/561; 307/264
[58] Field of Search ............... 307/200 A, 443, 446, 307/454, 456, 460, 542, 546, 547, 549, 551, 559, 561, 565, 264, 317 R; 333/22 R; 361/401, 415; 338/307-314, 254-255

[56] References Cited

U.S. PATENT DOCUMENTS

| | | | |
|---|---|---|---|
| 3,283,259 | 11/1966 | Banks | 307/559 X |
| 3,723,759 | 3/1973 | Giguere | 307/443 |
| 3,727,072 | 4/1973 | Madrazo et al. | 307/443 |
| 3,775,706 | 11/1973 | Jones et al. | 333/22 R |
| 3,832,575 | 8/1974 | Dasgupta et al. | 307/443 |
| 4,015,147 | 3/1977 | Davidson et al. | 333/22 R X |
| 4,220,876 | 9/1980 | Ray | 307/559 X |
| 4,454,566 | 6/1984 | Coyne | 361/415 X |
| 4,508,981 | 4/1985 | Dorler et al. | 307/542 |

OTHER PUBLICATIONS

Bode et al, "Dynamic Active Terminator Circuit", *IBM T.D.B.*, vol. 19, No. 10, 3-1977, p. 3745.
Barish et al, "Active Terminator", *IBM T.D.B.*, vol. 17, No. 7, 12-1974, p. 1960.
Gopalakrishna et al, "Ground-Up Low-Power Bipolar Circuit", *IBM T.D.B.*, vol. 17, No. 1, 6-1974, pp. 111-112.
Cases et al, "Multifunctional Diode Terminator Network", *IBM T.D.B.*, vol. 21, No. 5, 10-1978, pp. 1881-1882.

*Primary Examiner*—Stanley D. Miller
*Assistant Examiner*—D. R. Hudspeth
*Attorney, Agent, or Firm*—Wolf, Greenfield & Sacks

[57] ABSTRACT

A digital logic bus termination module that is to be plugged into a TTL logic backplane bus and in which the module includes a TTL logic circuit chip package having multiple terminals including a reference terminal, input terminal and output terminal. The TTL logic circuit chip package comprises an input diode, preferably a Schottky diode connected to the input terminal thereof and forming a bus termination clamping means. The bus line is connected to the input terminal of the chip package while the bus reference line is coupled to the reference or ground terminal for the circuit chip package. The TTL logic circuit chip package has the output terminal thereof unconnected so that only the diode is in operative association with the bus. One or more resistors may also be used in parallel with the clamping diodes for impedance matching purposes.

7 Claims, 14 Drawing Figures

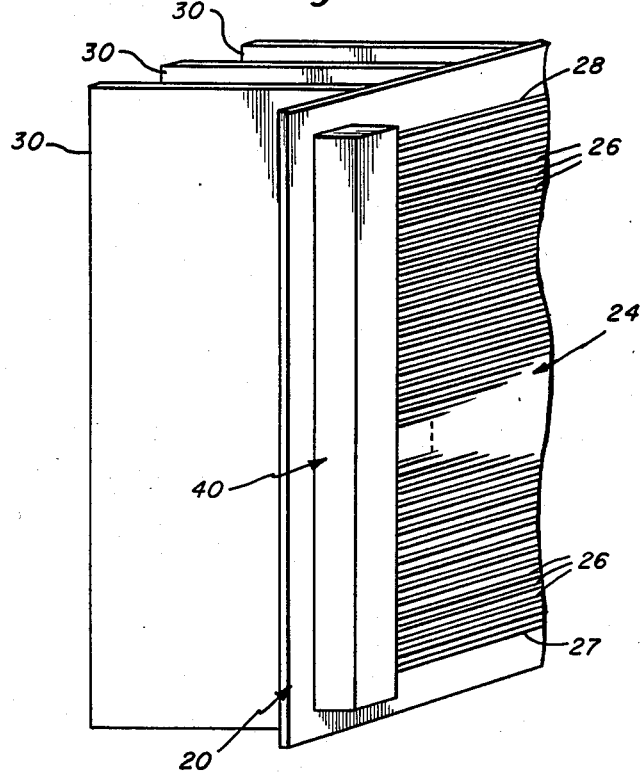
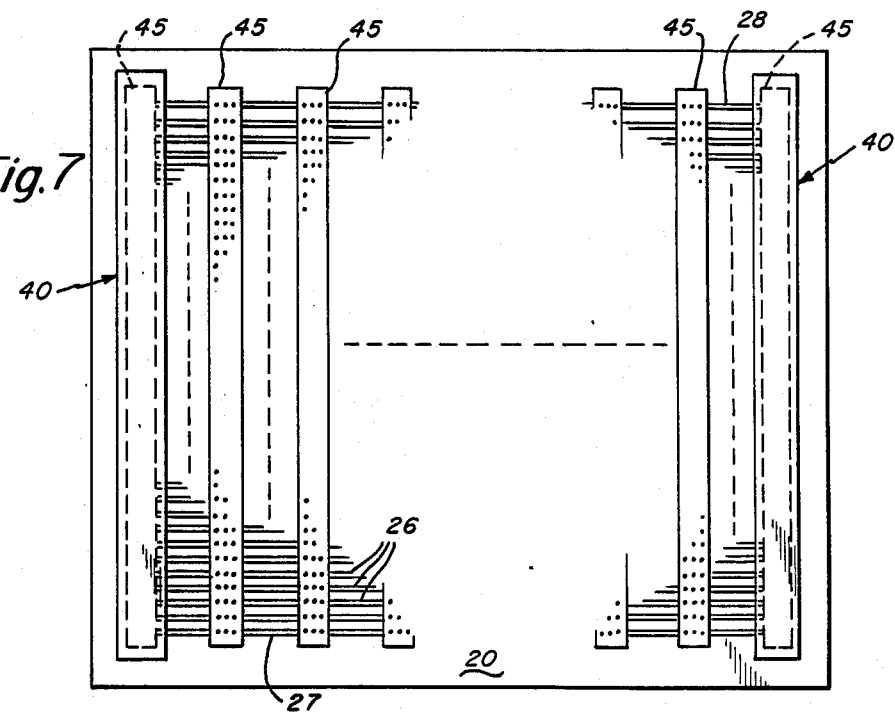

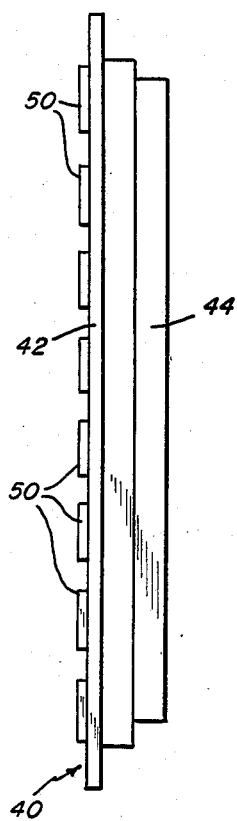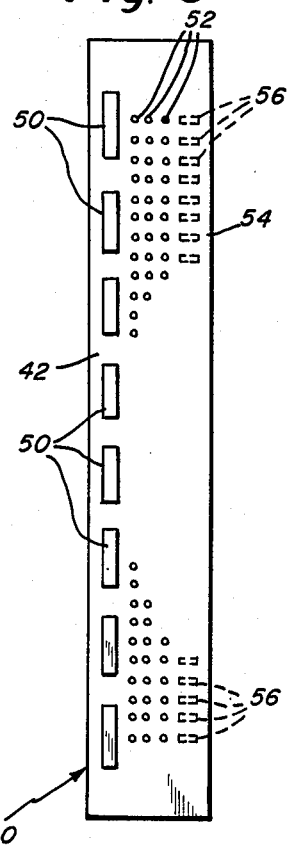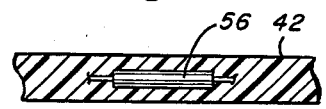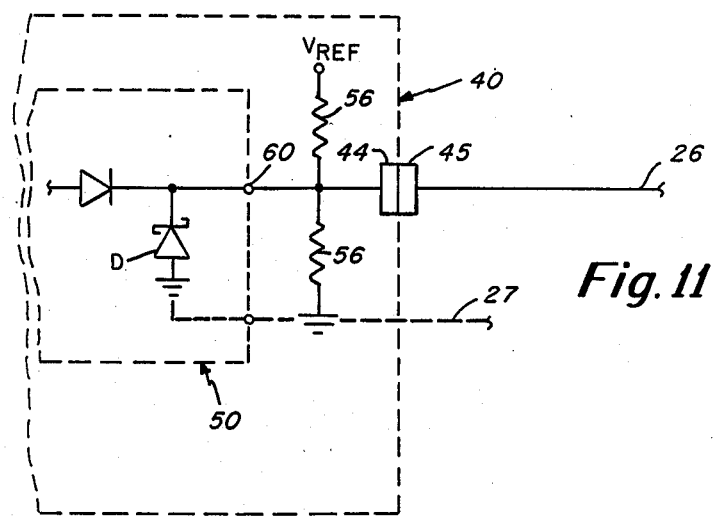

DIGITAL LOGIC BUS TERMINATION USING THE INPUT CLAMPING SCHOTTKY DIODES OF A LOGIC CIRCUIT

BACKGROUND OF THE INVENTION

The present invention pertains in general to a digital logic bus termination technique and pertains, more particularly, to a termination module for TTL backplane busses.

In a computer system, circuit boards are typically supported from a master support board that comprises a backplane bus which, is in turn comprised of conductive runs intercoupling the various circuit boards for flow therebetween. The various bus signals are typically subject to interference and impedance mismatch problems. For example, an undesired voltage appearing at the input of a logic gate may cause an unwanted signal transition. But if the input is, for example, a logic zero, a noise signal exceeding the logic zero threshold voltage causes the device to change its state as though the input signal were a logic one. Alternatively, if the input is a logic one, a noise signal (due to reflection energy and not induced noise) that decreases the input voltage level less than logic one may cause a transition to the logic zero state.

A typical conventional approach to resolving the impedance mismatch or noise problem in TTL backplane buses is to delay sampling. In this regard the TTL backplane buses are typically designed so that a signal propagating down the bus is sampled after some fixed settling time to permit reflections caused by impedance discontinuities to attenuate to a valid logic level. However, this settling down technique results in delayed sampling rates which result in overall decreased bus bandwidths.

The ringing caused by impedance dicontinuities is illustrated in FIGS. 1A–1D. FIG. 1A illustrates the logic one to logic zero transition. FIG. 1B illustrates the same transition but with the further use of a clamping diode. FIG. 1C illustrates the logic zero to logic one transition. FIG. 1D illustrates the same transition as in FIG. 1C but again with the use of a diode clamp.

It is noted in FIG. 1A that the initial undershoot caused by a logic one to logic zero transition is followed by another reflection which is a positive overshoot. This positive overshoot can cross the logic one threshold again. If the logic level of the signal is sensed at that time then there is an incorrect logic level sensed due to this positive overshoot in FIG. 1A.

A reflection also occurs on a logic zero to logic one transition such as illustrated in FIG. 1C. However, this is less likely to occur as the output impedance of a TTL gate driving a logic one is higher (40–50 ohms) than when driving a logic zero (10–20 ohms), resulting in less impedance mismatch relative to the interconnecting transmission line. Additionally, a valid logic one region is typically higher than the logic zero region (approximately 1.5 volts vs. approximately 0.8 volts) requiring more reflection energy to force a logic one level across the logic zero threshold.

Another conventional approach to reducing mismatches is to terminate the bus at its extreme ends at an impedance closely matching the characteristic impedance of the etch trace on the bus board. Although this approach minimizes the mismatch, it does not eliminate it entirely. In this regard refer to FIG. 2 which shows the termination of the bus at its extreme ends in an impedance closely matching the characteristic impedance of the etch trace thus reducing undershoot and overshoot but not eliminating them entirely.

FIG. 3 illustrates another solution to the undershoot or overshoot problem. This is the use of clamping diodes in addition to the terminating impedance. The non-linear voltage/current characteristics of the diode clamps the voltage to within one diode drop of the reference level reducing the undershoot (logic zero to logic one case as in FIG. 1C) and the overshoot (logic one to logic zero case as in FIG. 1A).

Providing bus terminations may well require the use of terminations for 70 different signals. When employing discrete components, this makes for a relatively large terminator block that is not readily accommodated on the backplane bus. Even employing a commercially available resistor package the size of the terminating package is still too large to be readily accommodated on the backplane bus.

Accordingly, it is an object of the present invention to provide an improved digital logic bus termination that is preferably in modular form and of a size that is readiy accommodated by the backplane bus.

Another object of the present invention is to provide a logic bus termination module formed by a small circuit board, supporting on one side thereof, a connector and, on the other side, surface mounted logic means for providing diode terminations.

A further object of the present invention is to provide an improved logic bus terminating module in accordance with the preceding object and in which resistors are used in combination with the diodes with the resistors being fabricated embedded in the aforementioned circuit board.

Another object of the present invention is to provide an improved logic bus termination module that may be readily releasably plugged into the backplane to be used where needed.

Still another object of the present invention is to provide an improved digital logic termination module that employs readily available TTL logic elements that include preferably a plurality of Schottky clamp diodes to perform backplane bus clamping at the termination.

Still another object of the present invention is to provide a logic bus termination module in accordance with the preceding object and in which the module can be fabricated relatively inexpensively using a wide variety of available logic elements connected so that only the diode clamp thereof is used in the circuit.

SUMMARY OF THE INVENTION

To accomplish the foregoing and other objects features and advantages of the invention there is provided a digital logic bus termination module that is adapted to be plugged into a TTL logic backplane bus. Typically, the backplane bus has multiple bus lines or bus runs along with a voltage reference and ground reference. The digital logic bus termination module employs a TTL logic circuit chip package having multiple terminals including a pair of power receiving reference terminals, at least one input terminal and at least one output terminal. The logic circuit chip package employs a diode which is preferably a Schottky clamping diode that provides backplane bus clamping at the termination. Most TTL logic families (FAST, S, LS, ALS, AS) use the Schottky diode clamp at their input stages and thus may be employed herein. Means are provided connecting the bus line to the input terminal of the TTL logic circuit chip package. Means also are provided for connecting the bus reference line to the TTL logic circuit chip package reference terminal. The TTL logic circuit chip package has the output terminal thereof unconnected so that only the diode is in operative association with the bus. In accordance with the invention the termination module further comprises a circuit board, a connector supported on one side of the circuit board and means on the other side of the circuit board for supporting the TTL logic circuit chip package or packages.

In accordance with the invention it is preferred to also provide a resistor termination essentially in parallel with the diode termination. In accordance with the invention a planar resistor technique is employed for embedding the resistor in the aforementioned circuit board. This technique along with the surface mounting of the TTL packages provides an overall terminating module that is of relatively small area. In one version the size of the module is 2.8 square inches including an area for a ninety-six pin connector.

BRIEF DESCRIPTION OF THE DRAWINGS

Numerous other objects, features and advantages of the invention should now become apparent upon a reading of the following detailed description taken in conjunction with the accompanying drawings, in which:

FIG. 6 is a schematic perspective view illustrating the backplane with circuit boards mounted on one side thereof and the termination module or modules supported on the other side thereof;

FIG. 7 is a side elevation view of the backplane bus construction illustrating multiple connectors and furthermore illustrating a termination module at either end of the bus;

FIG. 8 is a side elevation view of the termination module;

FIG. 9 is a front view of the termination module;

FIG. 10 is a fragmentary cross-sectional view showing the embedded resistor associated with the circuit board of the termination module; and FIG. 11 schematically illustrates connection of the bus line with the termination module.

DETAILED DESCRIPTION

In accordance with the invention there is provided a digital logic bus termination module that is formed so as to provide a relatively small module. Advantage is taken of the use of one or more TTL logic elements in the form of chip packages that presently include at their input a Schottky clamping diode. This diode performs the backplane bus clamping at the termination module. By way of example, refer to FIG. 4 which shows such a TTL logic package having inputs at A and B and an output at C. Also noted is the Schottky diode D1 connected at input A and the Schottky diode D2 connected at input B. In this connection there are only two connections that are made to the logic circuit per bus line. In this connection refer to FIG. 5 which shows the bus line or transmission line 10 with associated terminating resistors R coupled, respectively, between the bus ground and bus reference referred to as voltage $V_{REF}$. The ground pin on the package or the circuit is connected to the system ground reference such as indicated by the dashed line 12 in FIG. 5. The other connection is the connection of the input pin such as either input A or input B to the signal line being terminated or in other words the bus line 10. This is illustrated by the conductive connection 14 in FIG. 5. The other terminals of the chip package are unconnected. Thus, the output terminal C is unconnected and in FIG. 4 the voltage terminal $V_{CC}$ is unconnected. This thus means that essentially only the Schottky clamping diodes are used in the overall circuit. At first this may appear to be a waste but in actuality the circuit chips are readily available items and provide a relatively small package for providing clamping diodes particularly in comparison with trying to mount discreet components directly on the module circuit board.

Figure 4:
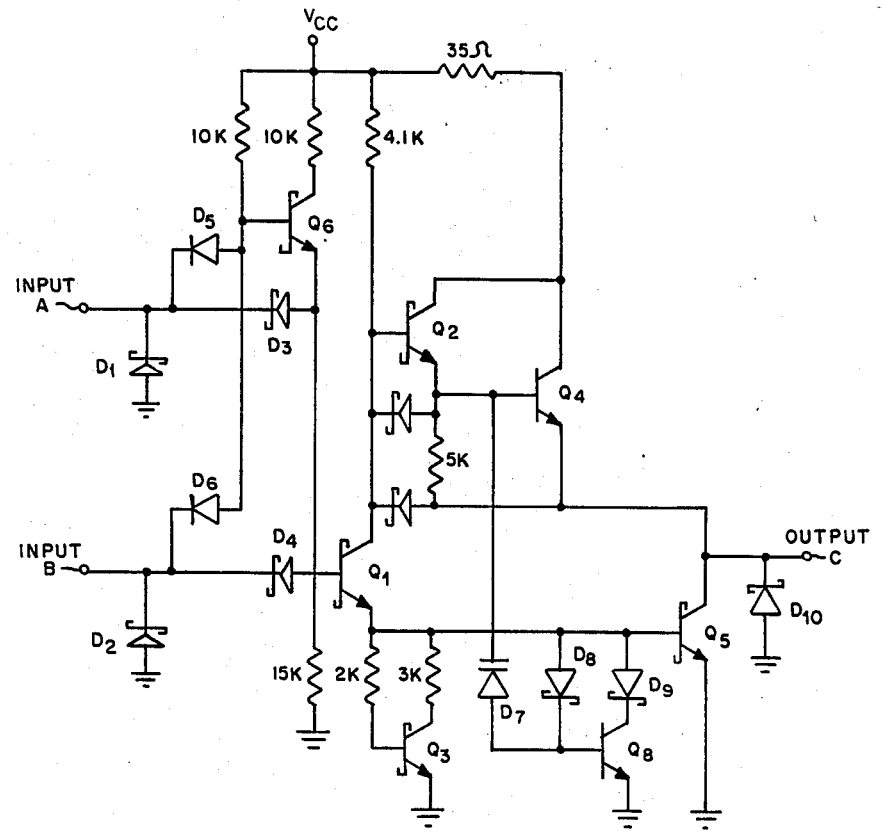
FIG. 4 illustrates a TTL logic circuit chip package that may be used in accordance with the invention having two inputs of this case and employing a Schottky clamping diode at each input, the output and $V_{CC}$ reference being unconnected.
Figure 5:
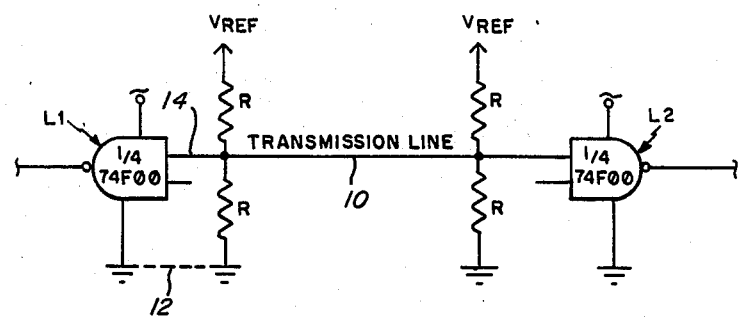
FIG. 5 is a schematic diagram illustrating the use of the logic element of the TTL logic element of the present invention as a termination means.

In FIG. 5 the detailed circuit of FIG. 4 is illustrated simply by the logic circuits L1 and L2. It should be kept in mind that each of the bus lines are terminated at either end with the use of these logic circuit packages thus providing a diode termination associated with each respective bus line with a termination being provided at each end of the bus or transmission line such as illustrated in FIG. 5.

Figure 1A:
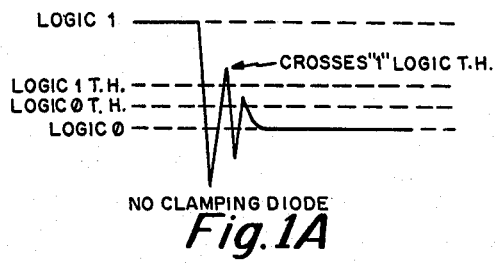
FIGS. 1A-1D illustrate logic transition waveforms showing waveforms for logic zero to logic one transition and logic one to logic zero transition and moreover illustrating modification of the waveform by use of a clamping diode.
Figure 1B:
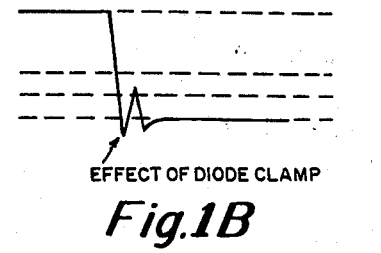
Figure 1C:
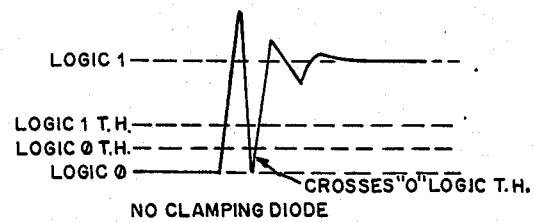
Figure 1D:
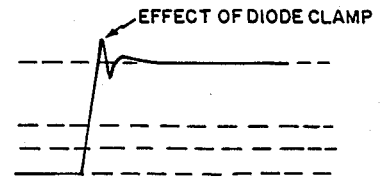
Figure 2:
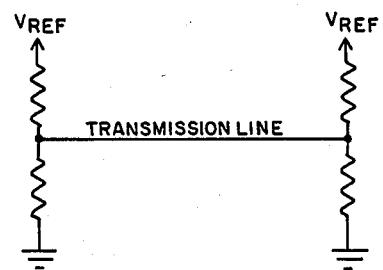
FIG. 2 schematically illustrates resistor terminations associated with the bus or transmission line.
Figure 3:
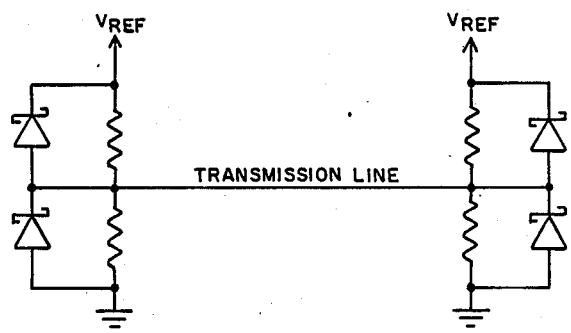
FIG. 3 illustrates the use of a resistor and diode termination associated with the bus or transmission line.

As also mentioned previously, the only active component out of the entire circuit of FIG. 4 are the two Schottky diodes D1 and D2. The only power dissipated in the TTL device is by the clamping diodes when they conduct to provide the clamping function such as is illustrated in FIGS. 1B and 1D.

Reference is now made to FIG. 6 for a schematic illustration of the TTL backplane 20 that supports the backplane bus such as illustrated at 24. The backplane bus comprises a plurality of bus or transmission lines 26 including, as illustrated in FIG. 6, the bus ground line 27 and the bus reference voltage line 28. On the back side of the backplane 20 support is provided via connectors for a plurality of circuit boards 30. Each of these circuit boards contain components used, for example, in a computer system. The backplane bus 24 is the data communication means between these different circuit boards and for this purpose the backplane bus is conductively connected to each of the circuit boards.

FIG. 6 also shows a termination module 40 at one end of the backplane 20. Although not illustrated in FIG. 6 there is also preferably provided another termination module at the opposite end of the backplane so as to provide the desired termination at either end of the backplane bus. In accordance with the invention the termination module provides termination on an individual basis for each of the bus lines 26. In this connection reference has been made hereinbefore to FIG. 5 that shows an individual one of the lines as represented by the transmission line 10 in FIG. 5 showing terminations at either end thereof.

Reference is now made to FIGS. 8–10 for further details of the termination module 40. In FIG. 6 the termination module 40, for simplicity, is simply shown as a box. However, in FIGS. 8–10 further details are now given of the termination module 40. The module 40 comprises a circuit board 42 which forms the main support for the module. On one side of the circuit board 42 there is mounted a multipin connector 44 which may be a female connector and that is adapted to mate with a corresponding male connector suported on the backplane 20. in this connection refer to FIG. 7 which shows the module 40, one at each end of the backplane 20. FIG. 7 also illustrates intermediate positions wherein there are provided the male connectors 45 to which the connector 44 of the termination module may engage. For some applications the circuit boards 30 are coupled so that the bus is not the full width of the bus plane in which case the modules 40 may be interchanged to other connector positions. In this connection it is also noted that in FIG. 7 there is shown in dotted outline the connectors 45 associated with the end termination modules 40.

In FIG. 8, on the opposite side of the printed circuit board 42, to the connector 44, there are mounted a plurality of TTL logic circuit chip packages 50. For example, each of the packages 50 may be of type 74LS10. Another circuit package type is SN54ALS15 or type SN74ALS15. Both of these type are three input positive AND gate circuits with open collector outputs. Each package contains three separate gates with three inputs per gate and thus there are a total of nine inputs that are available, each input having associated therewith a Schottky diode. For the sake of explanation one circuit type is illustrated in FIG. 4 in which there are only two inputs shown. In a complete package there may actually be four of the circuits of FIG. 4 shown providing a total of eight inputs available per package. Each of these inputs are connected to one of the bus lines such as in the manner illustrated in FIG. 11 and discussed in further detail hereinafter.

FIG. 9 shows the circuit board 42 with a total of eight packages 50 secured thereto. FIG. 9 also shows the pins at 52 associated with the connector 44. At the edge 54 of the board 42 there are provided a series of embedded resistors 56. In this connection also refer to the fragmentary cross-sectional view of FIG. 10 which shows the circuit board 42 and one of the embedded resistors 56.

The arrangement illustrated in FIGS. 8–10 provides a very compact module. As indicated previously this has an overall size of about 2.8 square inches including the connector which may provide for 96 contact points.

Reference is now made to FIG. 11 which shows one of the bus lines 26. Of course, there are a plurality of bus lines as illustrated in FIGS. 6–7 and each of these will have a terminating resistor and at least one terminating diode associated therewith. In the illustration of FIG. 11 the bus line 26 is illustrated as connecting by way of the connector parts 44 and 45 to the termination module 40 shown in dotted outline. The connector part 44 is actually part of the termination module 40. FIG. 11 also shows the embedded resistors 56 also illustrated as to position in FIG. 9. One side of one of the resistors 56 is coupled to the bus line by the connector and the other side is coupled to the voltage reference. The voltage reference on the termination module is in turn coupled to the bus reference. In this regard note line 28 in FIG. 6. The other resistor 56 is also coupled to the bus line 26 and on its other side is coupled to the module ground which in turn couples to the bus ground reference. In this connection note the line 27 FIG. 6.

FIG. 11 also illustrates the Schottky diode D which forms part of the chip package 50. Other components also form part of the chip package but are essentially not in the active circuit due to the mode of connection with the chip package. As indicated previously and with reference to FIG. 11, the ground pin on the package is coupled to the system ground reference and the input pin to the chip package at 60 is coupled to the signal being terminated or in other words the bus line 26 in the illustration of FIG. 11. As also mentioned previously, the other terminals, other than the input terminals of the chip package, are left unconnected.

Having now described the limited number of embodiments of the present invention, it should now be apparent to those skilled in the art of numerous other embodiments and modifications thereof are contemplated as falling within the scope of the present invention as defined by the appended claims.

What is claimed is:

1. A digital logic bus termination module adapted to be plugged into a TTL logic backplane bus, said backplane bus having multiple bus lines and a reference line, and comprising;
   a TTL logic circuit chip package having multiple terminals including a pair of power receiving reference terminals, at least one input terminal, and at least one output terminal,
   said TTL logic circuit chip package comprising a diode connected to each respective input terminal thereof forming a bus termination clamping means,
   means connecting the bus lines to each respective input terminal of the TTL logic circuit chip package,
   means connecting the bus reference line to the TTL logic circuit chip package reference terminal,
   said TTL logic circuit chip package having said output terminal thereof unconnected whereby only the diode is in operative association with the bus.

2. A digital logic bus line termination module as set forth in claim 1 wherein said module further comprises a circuit board, a connector supported on one side of the circuit board and means on the other side of the circuit board for supporting said TTL logic circuit chip package.

3. A digital logic bus line termination module as set forth in claim 2 wherein said TTL logic circuit chips package has multiple input terminals each including a diode connected thereat.

4. A digital logic bus line termination module as set forth in claim 3 wherein said diode comprises a Schottky diode.

5. A digital logic bus line termination module as set forth in claim 4 including a terminating resistor electrically connected in parallel with the diode.

6. A digital logic bus line termination module as set forth in claim 5 wherein said resistor is a planar resistor embedded in the circuit board.

7. A digital logic bus termination module adapted to be plugged into a logic back plane bus, said back plane bus having multiple bus lines and a reference line, said module comprising, a logic circuit chip package having multiple terminals, including a pair of power receiving reference terminals and multiple input terminals with corresponding multiple output terminals, said logic circuit chip package comprising a Schottky diode connected at each of said input terminals forming a plurality of bus termination clamping means, means connecting the multiple bus lines to the multiple input terminals respectively of the logic circuit chip package, means connecting the bus reference line to the logic circuit chip package reference terminal, said logic circuit chip package having said output terminals thereof unconnected whereby only the Schottky diodes are in operative association with the bus lines.

* * * * *